United States Patent [19]

Sooriakumar et al.

[11] Patent Number: 5,600,071
[45] Date of Patent: Feb. 4, 1997

[54] VERTICALLY INTEGRATED SENSOR STRUCTURE AND METHOD

[75] Inventors: K. Sooriakumar, Scottsdale; David J. Monk, Mesa; Wendy K. Chan, Scottsdale; Kenneth G. Goldman, Chandler, all of Ariz.

[73] Assignee: Motorola, Inc., Schaumburg, Ill.

[21] Appl. No.: 684,723

[22] Filed: Jul. 22, 1996

Related U.S. Application Data

[63] Continuation of Ser. No. 523,422, Sep. 5, 1995, abandoned.

[51] Int. Cl.[6] .................................................... G01L 9/06
[52] U.S. Cl. ................................................................ 73/721
[58] Field of Search ............................. 73/720, 721, 726, 73/727; 338/4, 5, 42

[56] References Cited

U.S. PATENT DOCUMENTS

| | | | |
|---|---|---|---|
| 3,204,463 | 9/1965 | Taber | 73/726 |
| 4,023,562 | 5/1977 | Hynecek et al. | 73/727 |
| 4,222,277 | 9/1980 | Kurtz et al. | 73/721 |
| 4,291,293 | 9/1981 | Yamada et al. | |
| 4,500,864 | 2/1985 | Nakane et al. | 338/4 |
| 4,802,952 | 2/1989 | Kobori et al. | |
| 4,823,605 | 4/1989 | Stein | |
| 4,841,777 | 6/1989 | Hershey et al. | 73/721 |
| 4,876,893 | 10/1989 | Kato et al. | 73/726 |
| 4,939,497 | 7/1990 | Nishida et al. | 73/720 |
| 5,029,479 | 7/1991 | Bryan | 73/721 |
| 5,132,559 | 7/1992 | Baskett | |
| 5,318,652 | 6/1994 | Hocker et al. | |

OTHER PUBLICATIONS

Motorola "Sensor Device Data", 3rd Edition, 1995, pp. iii–vi.

Ljubisa Ristic, "Sensor Technology and Devices", Artech House — (Boston–London), 1994, pp. vii—xii, 386–390, 446–447.

Tanigawa et al., "Mos Integrated Silicon Pressure Sensor", Reprinted from IEEE Trans, Electron Devices, vol. ED–32, No. 7, pp. 1191–1195 (165–169), Jul. 1985.

*Primary Examiner*—Richard Chilcot
*Assistant Examiner*—William L. Oen
*Attorney, Agent, or Firm*—Kevin B. Jackson

[57] ABSTRACT

A vertically integrated sensor structure (60) includes a base substrate (71) and a cap substrate (72) bonded to the base substrate (71). The base substrate (71) includes a transducer (78) for sensing an environmental condition. The cap substrate (72) includes electronic devices (92) formed on one surface to process output signals from the transducer (78). The sensor structure (60) provides an integrated structure that isolates sensitive components from harsh environments.

23 Claims, 3 Drawing Sheets

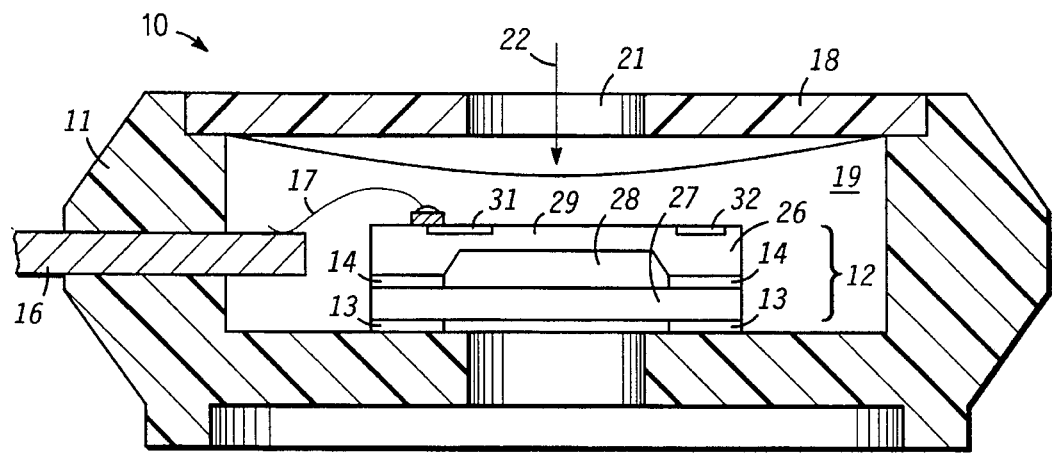
FIG. 1
-PRIOR ART-
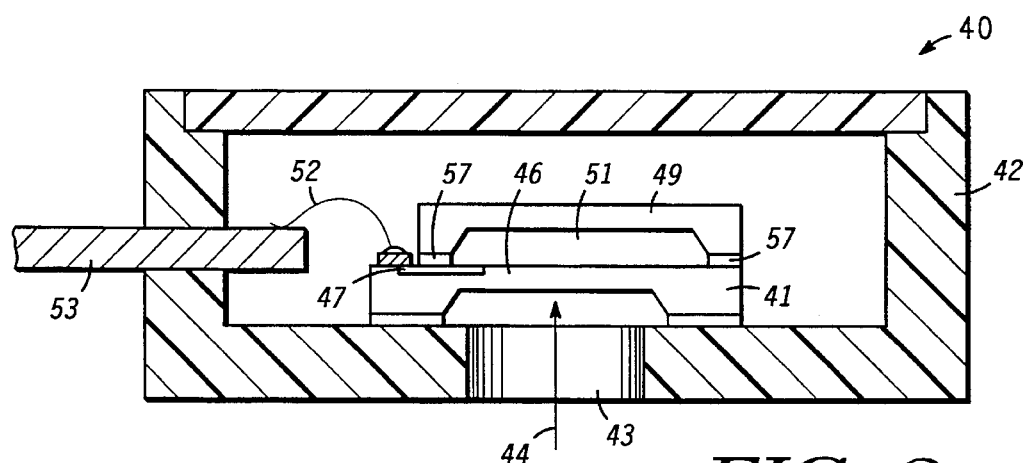
FIG. 2
-PRIOR ART-
FIG. 4
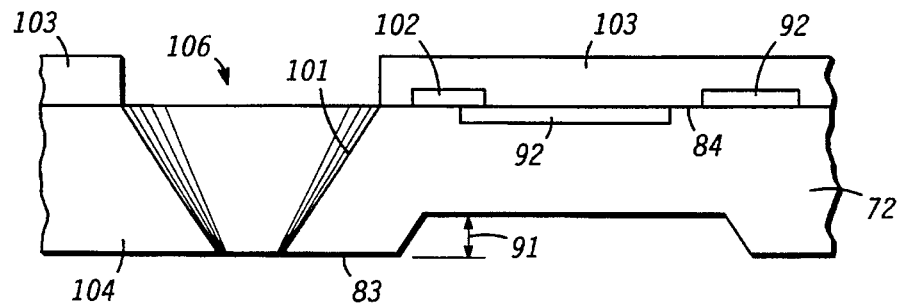

5,600,071

VERTICALLY INTEGRATED SENSOR STRUCTURE AND METHOD

This application is a continuation of prior U.S. patent application Ser. No. 08/523,422, filed Sep. 5, 1995, now abandoned.

BACKGROUND OF THE INVENTION

This invention relates, in general, to electronic devices, and more particularly, solid state sensor devices.

Solid state sensor devices including silicon-based pressure sensor devices are well known and are used, for example, in automotive, industrial, and biomedical applications. A significant number of applications are becoming important where pressure sensor devices are exposed to harsh environments. Such environments include solvent mixtures (e.g., fuels), water, salt water, acids, and bases. Users have found that standard pressure sensor devices fail in such environments. For example, solvents can cause swelling and/or dissolution of polymeric packaging materials; salt water, acids or bases can corrode metallic surfaces; and water, acids, and bases can etch silicon surfaces.

Manufacturers have used several approaches in an attempt to achieve media compatibility. In one approach, fluorosilicone gels are used to protect the sensor device, wirebonds, portions of the package, and leads. Fluorosilicone gels have several disadvantages including an incompatibility with fuels (e.g., swelling).

In another approach, manufacturers use organic coatings (e.g., parylene) to protect those surfaces of the sensor exposed to the harsh media. The organic coatings are used either alone or together with fluorosilicone gels. Organic coatings have several disadvantages including poor process throughput (i.e., low units/hour), negative effects on electrical parameters, and delamination, which can lead to corrosion failures. Additionally, complicated adhesion promotion process techniques are required to prevent the organic coatings from delaminating, which adds to process cycle time and cost.

In still another approach, the back side or the side that does not contain any electronic devices is the only side exposed to the harsh media. This approach is suitable for differential pressure sensor devices with harsh media on the back side of the diaphragm only but not for absolute pressure sensor devices unless a topside constraint is used. With the topside constraint approach, a constraint substrate is attached to the sensor device to provide a hermetically sealed chamber with the lower side of the sensor being exposed to the harsh media. One disadvantage of this approach is that once the constraint substrate is attached to the sensor device, laser trimming of resistors present on the sensor device is not practical.

As is readily apparent, media compatible sensor structures and methods are needed that overcome the disadvantages of the prior art. It would be of further advantage to have cost effective structures that utilize proven processing techniques.

BRIEF DESCRIPTION OF THE DRAWINGS

FIG. 1 illustrates an enlarged cross-sectional view of a prior art sensor structure;

FIG. 2 illustrates an enlarged cross-sectional view of another prior art sensor structure;

FIG. 4 illustrates an enlarged cross-sectional view of a cap substrate according to the present invention.

DETAILED DESCRIPTION OF THE DRAWINGS

Figure 3:
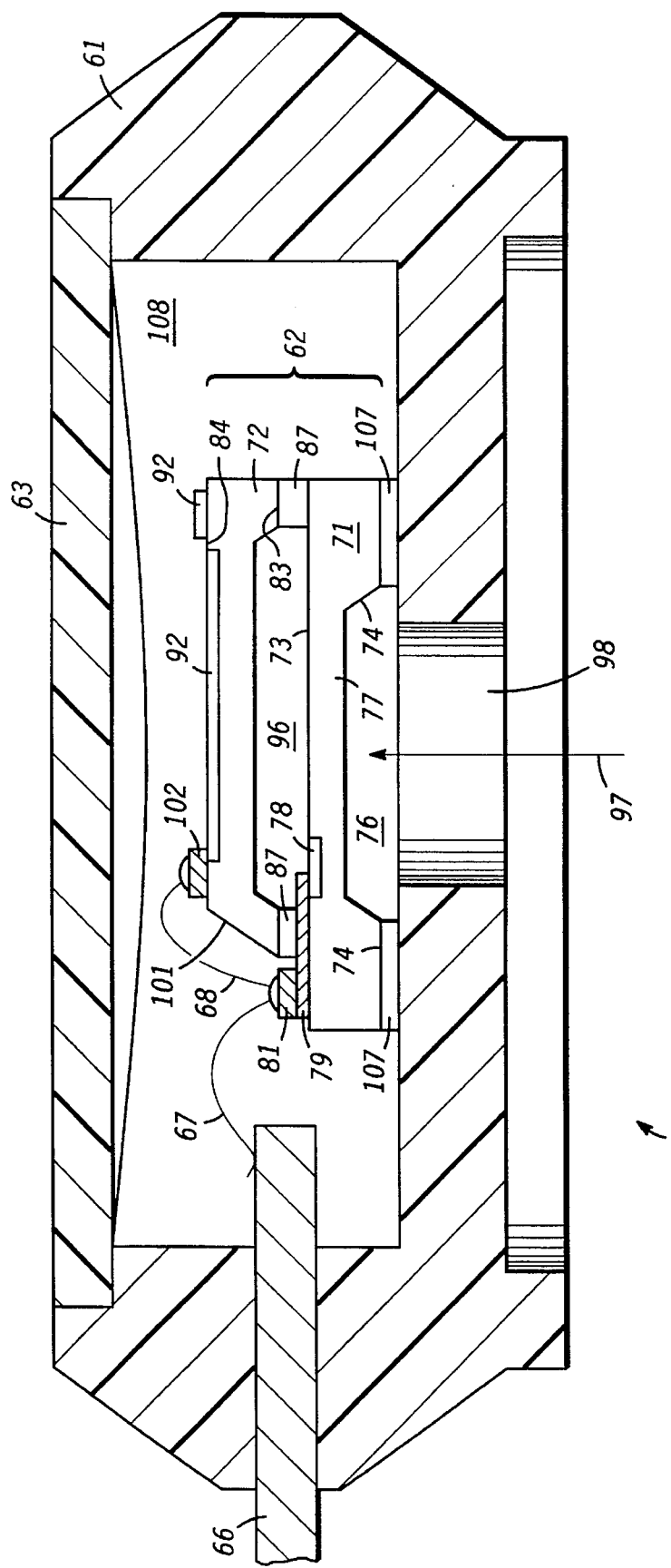
FIG. 3 illustrates an enlarged cross-sectional view of a vertically integrated sensor structure according to the present invention.

In general, the present invention relates to a media compatible vertically integrated sensor device. In particular, the vertically integrated sensor device includes a base substrate having a transducer and a diaphragm for measuring an environmental condition and a cap substrate attached to the base substrate. The cap substrate has electronic devices (e.g., passive devices and/or active devices) formed on one surface and is coupled to receive an output signal from the transducer. The electronic devices provide, among other things, signal amplification, signal conditioning, temperature compensation, span compensation, data storage, data processing, load control, or combinations thereof.

FIG. 1 illustrates an example of a prior art absolute pressure sensor structure. Sensor structure 10 includes a package 11 and a pressure sensor device 12 bonded to package 11 by a bonding layer 13. Sensor structure 10 further includes leads 16 integral with package 11, a wire bond 17 connecting pressure sensor device 12 to one of leads 16, lid 18 attached to package 11, and protective coating 19 (e.g., a fluorosilicone gel) covering pressure sensor device 12, wire bond 17, and a portion of leads 16. Lid 18 includes a hole or aperture 21 that provides an opening to expose pressure sensor device 12 to an environmental condition (generally represented by arrow 22).

Pressure sensor device 12 comprises a semiconductor die 26 and a constraint die 27. Semiconductor die 26 includes a cavity 28 and is attached under vacuum conditions to constraint die 27 using, for example, a glass frit layer 14 to provide a zero pressure reference. Semiconductor die 26 further includes a diaphragm 29, a transducer 31, and an electronic device 32. Transducer 31 comprises, for example, a piezoresistive element that provides an output signal when pressure is applied to the upper surface of diaphragm 29. Transducer 31 is coupled to electronic device 32 to provide, for example, signal conditioning and/or signal amplification. Electronic device 32 typically includes adjustable resistive elements (e.g., trimmable resistors) that are adjusted at a package level (e.g., using laser trim techniques) to provide a pressure sensor device having electrical parameters within a desired specification.

Pressure sensor structure 10 has several disadvantages when exposed to harsh environments such as fuels. For example, protective coating 19 typically is incompatible with fuels (i.e., protective coating 19 tends to swell in the presence of fuels). When protective coating 19 subsequently contracts, it tends to contract beyond its initial volume thereby exposing wire bond 17 and/or pressure sensor device 12. Also, protective coating 19 tends to be permeable to harsh substances allowing them to pass through protective coating 19 to wire bond 17 and pressure sensor device 12. Once the harsh substances reach wire bond 17 and pressure sensor device 12, corrosion, among other things, takes place causing reliability problems.

FIG. 2 illustrates an enlarged cross-sectional view of another prior art absolute pressure sensor structure. Sensor structure 40 comprises pressure sensor device 41 attached to a package structure 42. Package structure 42 has an opening 43 for exposing pressure sensor device 41 to a pressure condition to be measured as generally represented by arrow 44. Pressure sensor device 41 includes a diaphragm 46 and a transducer 47 that provides an output signal when sensor structure 40 is exposed to the pressure condition. Wire bonds 52 couple pressure sensor device 41 to leads 53.

A constraint die 49 is attached under vacuum conditions to the upper surface of pressure sensor device 41 to form a vacuum cavity 51, which provides a zero pressure reference. Constraint die 49 is attached to pressure sensor device 41 using bonding layer 57, which typically comprises a glass (e.g. borosilicate glass).

Sensor structure 40 has an advantage over sensor structure 10 in that transducer 47 and wire bond 52 are isolated from the harsh media (i.e., only the lower side of pressure sensor device 41 is exposed to the harsh media through opening 43). However, sensor structure 40 has a disadvantage because constraint die 49 complicates the integration of signal processing and/or amplification circuits on pressure sensor device 41.

Constraint die 49 prevents a manufacturer from calibrating devices using on-chip trimmable resistors following the packaging of pressure sensor device 41. This is because the resistors cannot be trimmed through constraint die 49. Constraint die 49 is attached to pressure sensor device 41 while both are in wafer form due to manufacturing constraints. Resistor trimming takes place at the package level while the pressure sensor device is subjected to various temperature and pressure conditions to calibrate for both fabrication and assembly variations. In other words, trimming is not as effective for complete device calibration if it takes place at wafer level before constraint die 49 is attached to pressure sensor device 41.

Manufacturers get around this problem by connecting a second chip either external to sensor structure 40 or adjacent to pressure sensor device 41 (i.e., in a side-by-side configuration) in a larger package to provide any signal conditioning and/or signal amplification. These approaches have several disadvantages including a larger overall device foot print (which makes the package too large for many applications), an added substrate (i.e., an absolute pressure sensor device requires a third substrate), added assembly cost, and a departure from an industry-wide trend of integration.

FIG. 3 illustrates an enlarged cross-sectional view of an embodiment of a media compatible vertically integrated pressure sensor structure according to the present invention. The embodiment shown in FIG. 3 is an absolute pressure sensor embodiment. Pressure sensor structure or sensor structure 60 comprises a package or chip carrier structure 61, sensor device 62, a lid or cover 63, conductive leads 66 (only one lead is shown), and wire bonds 67 and 68. Sensor device 62 comprises a base substrate or portion 71 and a cap substrate or portion 72 attached to major surface 73 of base substrate 71.

Base substrate 71 comprises a semiconductor material (e.g., silicon, gallium arsenide, or the like) and includes a cavity 76 extending from a major surface 74. Cavity 76 terminates to form a diaphragm 77. Techniques for forming cavity 76 are well known. Cavity 76 is shown with tapered sidewalls. Cavity 76 optionally has straight sidewalls, which provides for a smaller base substrate 71. Techniques for forming straight sidewalls are well known.

Base substrate 71 further includes a transducer 78 (e.g., a piezo-resistive element) formed on and extending from major surface 73. Conductive layers 79 (only one conductive layer is shown) connect transducer 78 to bonding pads 81 (only one bonding pad is shown). Conductive layers 79 comprise a metal, a metal-nitride, heavily doped silicon, a silicide, a doped polycrystalline semiconductor material (e.g. doped polysilicon), combinations thereof, or the like. When conductive layers 79 include heavily doped silicon, conductive layers 79 preferably extend from major surface 73 into base substrate 71.

Bonding pads 81 preferably comprise a metal such as aluminum, or an aluminum alloy. Techniques for forming conductive layers 79 and bonding pads 81 are well known. Optionally, a protective layer 111 (shown in FIG. 5) is formed over conductive layers 79. Protective layer 111 comprises, for example, a silicon nitride, a silicon oxide, combinations thereof, or the like.

Figure 5:
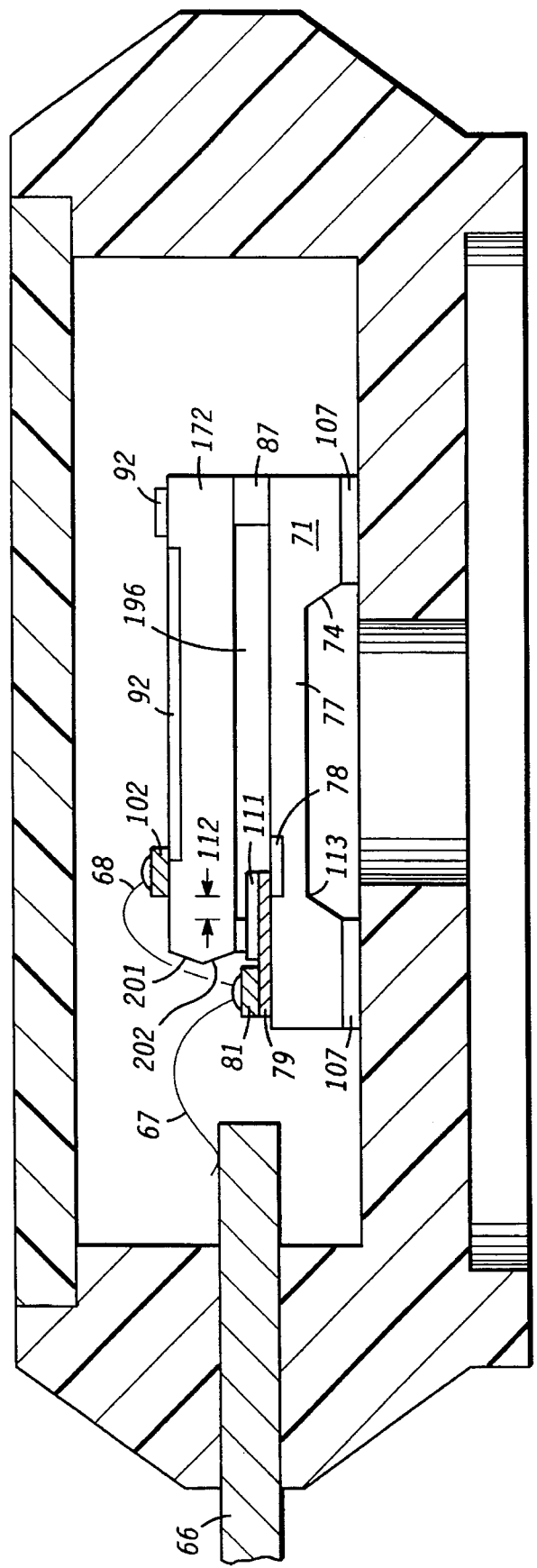
FIG. 5 illustrates an enlarged cross-sectional view of a portion of another vertically integrated sensor structure according to the present invention.

Cap substrate 72 comprises a semiconductor material (silicon, gallium arsenide, or the like), a semiconductor-on-insulator (SOI), or the like and includes a major surface 83 and a major surface 84. Cap substrate 72 optionally includes a cavity 91 (shown in FIG. 4) extending from major surface 83. Cavity 91 extends from major surface 83 to a distance of about 10 to about 200 microns. Cavity 91 is formed using well known techniques. Preferably, cavity 91 is formed at the end of wafer processing (i.e., after electronic devices have been formed on cap substrate 72) with a protective layer formed over major surface 84 to protect the electronic devices while cavity 91 is formed. Low temperature inorganic films such as plasma deposited silicon nitride films are suitable. Optionally, cap substrate 72 does not have a cavity (this optional embodiment is shown in FIG. 5).

Cap substrate 72 further includes electronic devices or integrated circuit devices 92 formed on and/or extending from major surface 84. Electronic devices 92 include passive and active components integrated to provide, among other things, signal conditioning, temperature compensation, span compensation, signal amplification, data storage, data processing, load control, and/or combinations thereof. For example, electronic devices 92 include capacitors, thin film resistors (e.g., adjustable resistors or resistive elements), diffused resistors, diodes, CMOS and bipolar logic devices or combinations thereof, insulated gate field effect transistor devices (IGFET) amplifier and/or switching devices, bipolar transistor amplifier and/or switching devices, JFET devices, and/or the like.

Circuit designs for integrated sensors incorporating the above devices are well known in the art. Examples are shown in L. Ristic ed., *Sensor Technology and Devices*, Artech House, (1994), *Sensor Device Data*, Motorola Inc., 3rd edition, 1995, U.S. Pat. No. 5,132,559 issued to I. Baskett, and H. Tanigawa et al., "MOS Integrated Silicon Pressure Sensor" IEEE Trans Electron Devices, vol. ED-32, no 7, pp. 1191–1195, July 1985. Techniques for forming electronic devices 92 are well known and include oxidation, deposition, ion implantation, diffusion, photolithographic, etching, and metallization techniques.

A portion of major surface 83 is attached to major surface 73 using a bonding layer 87. Bonding layer 87 comprises an anodic bonding layer, a eutectic bonding layer (e.g., gold/tin), a glass frit bonding layer, or the like. Preferably, bonding layer 87 comprises a glass frit material such as a low-melting-point (about 450° C. to about 550° C.) inorganic oxide glass (e.g., a mixture of lead borosilicate, lead titanate, and/or lead vanadate). Such glasses are available from Ferro, of Santa Barbara, Calif.(e.g., Ferro FX11-10).

To bond major surface 83 to major surface 73, the glass frit is applied, for example, to major surface 83 in the form of a paste, which consists of a mixture of glass frit and an organic binder. This glass paste is deposited using a conventional silk-screen process. Optionally, the glass paste is deposited onto major surface 73. A glass thickness of about 20 microns is suitable. Following the silk-screening step, cap substrate 72 is allowed to dry, then fired at high temperature to burn off the organic binder and sinter the powdered glass.

Next, major surface 83 and major surface 73 are aligned and placed into intimate contact with one another. The assembly is then heated under vacuum conditions to a temperature exceeding the softening point of the glass, which bonds major surface 83 to major surface 73. Equipment such as a glass frit bonder is suitable to join cap substrate 72 to base substrate 71. Such equipment is available from Electronic Visions Co. of St. Florian, Austria with major facilities in Phoenix, Ariz.

Typically, with a low enameling powdered glass, process temperatures below about 490° C. are used to avoid aluminum/silicon spiking and/or damaging transducer 78 and electronic devices 92. Once bonding is complete, a hermetically sealed cavity or chamber 96 is provided' chamber 96 functions as zero pressure reference when diaphragm 77 is exposed to an environmental condition as generally represented by arrow 97 through opening or pressure port 98.

Preferably, cap substrate 72 is bonded to base substrate 71 while both are in wafer form. That is, a wafer containing many cap substrates 72 is bonded to a wafer containing many base substrates 71 before either wafer is diced into individual chips. Optionally, the wafer containing many cap substrates 72 and the wafer containing many base substrates 71 are first diced and then individual cap substrates 72 are bonded to individual base substrates 71.

Preferably, cap substrate 72 includes a beveled edge 101 to better accommodate wire bonds 68, which electrically couple base substrate 71 to cap substrate 72. Wire bonds 67 and 68 preferably comprise gold or aluminum. Although only one each of wire bonds 67 and 68 are shown in FIG. 3, it is understood that multiple wire bonds are used to connect cap substrate 72 to base substrate 71, base substrate 71 to leads 66, and/or cap substrate 72 to leads 66. Other techniques may be used to electrically couple base substrate 71 to cap substrate 72 including buried contacts, diffused contacts, conductive clips, and/or combinations thereof.

Major surface 84 includes bond pads 102 (only one is shown) for coupling wire bonds 68 to cap substrate 72. Electronic devices 92 are coupled to bond pads 102 using conventional conductive lines (not shown). Additional bond pads 102 and wire bonds 68 (not shown) are used to electrically couple output signals from electronic devices 92 to leads 66.

FIG. 4 illustrates an enlarged cross-sectional view of cap substrate 72 to show a preferred method for forming beveled edge 101. First, while cap substrate 72 is in wafer form and not yet bonded to base substrate 71, a protective layer 103 is formed on major surface 84 of cap substrate 72 and on wafer portion 104, which is adjacent cap substrate 72 while cap substrate 72 is in wafer form. Typically, protective layer 103 comprises a material that does not etch while material between wafer portion 104 and cap substrate 72 is etched. Preferably, protective layer 103 comprises a dielectric layer such as a silicon nitride or a silicon oxide. After protective layer 103 is formed, opening 106 is etched. When cap substrate 72 comprises silicon, opening 106 is etched using conventional silicon etch techniques (e.g., potassium hydroxide (KOH), tetramethyl ammonium hydroxide (TMAH), or dry etch techniques (e.g., deep reactive ion etching techniques)). Such techniques are well known.

Referring back to FIG. 3, sensor device 62 is attached to chip carrier 61 using a bonding layer 107 such that major surface 74 is above or in a spaced relationship with opening 98. Bonding layer 107 comprises, for example, a lead glass, a gold/silicon eutectic, a lead/tin solder, an epoxy, an elastomeric die attach material (e.g., dimethyl silicone or fluorosilicone), or the like. Once sensor device 62 is attached to chip carrier 61, adjustable resistors present on cap substrate 72 are adjusted using, for example, well known laser trimming techniques while sensor structure 60 is exposed to various temperature and pressure conditions.

Optionally, sensor structure 60 includes a layer of protective gel 108 (e.g., fluorosilicone gel or the like) to protect the device from, for example, moisture. Protective gel 108 is not exposed to harsh media like in sensor structure 10 because media exposure occurs through opening 98 with only major surface 74 being exposed to the media. Thus, the swelling and corrosion problems discussed above are avoided. In an optional embodiment, major surface 74 is coated with a vapor deposited film such as a silicon nitride, silicon oxide, parylene, or the like to further enhance media compatibility.

FIG. 5 illustrates an enlarged cross-sectional view of a portion of another embodiment of a media compatible vertically integrated pressure sensor structure according to the present invention. Sensor structure 160 is similar to sensor structure 60, except that cap substrate 172 does not have a cavity. Further, cap substrate 172 has multiple beveled edges 201 and 202, which are formed, for example, by etching from both sides of cap substrate 172 instead of from one side as shown in FIG. 4. Additionally, sensor structure 160 includes a protective layer 111 on one of conductive layers 79.

In sensor structure 160, bonding layer 87 functions as a stand-off for providing a vacuum cavity or chamber 196. Preferably, bonding layer 87 is spaced a distance 112 from edge 113 of diaphragm 77 greater than about 50 microns to about 250 microns so that bonding layer 87 does not affect the functionality of diaphragm 77 and transducer 78.

Sensor structures 60 and 160 have several significant advantages over the prior art. First, enhanced media compatibility is provided because only the lower surface (i.e., major surface 74) or non-active side of base substrate 71 is exposed to the harsh environment. That is, the transducer, the electronic devices, wire bonds, and leads are isolated from the harsh media. Also, by placing the electronic devices on cap substrate 72, adjustable resistive elements can be trimmed at a package level to provide, among other things, accurate span and temperature compensation. Additionally, by placing the electronic devices on cap substrate 72, the overall die size and package foot print is reduced because external integration and side-by-side integration is avoided. This provides a very high level of integration in a very small package. Furthermore, the present invention is cost effective because it utilizes existing (i.e., proven reliable) processing techniques.

By now it should be apparent that a media compatible vertically integrated sensor device has been provided that has significant advantages over the prior art. Various other similar embodiments and modifications may be made by those skilled in the art without departing from the spirit and scope of the invention as set forth in the appended claims.

We claim:

1. A vertically integrated sensor device comprising:
   a base substrate having a first major surface, a second major surface opposite the first major surface, and a cavity extending from the second major surface to form a diaphragm, and wherein the base substrate comprises a semiconductor material;
   a transducer formed on the diaphragm;
   a cap substrate having a third major surface and a fourth major surface opposite the third major surface, wherein the third major surface is connected to the first major surface to provide a hermetically sealed chamber, and wherein the cap substrate comprises a semiconductor material; and
   an electronic device formed on the fourth major surface, wherein the electronic device is electrically coupled to the transducer.

2. The device of claim 1 wherein the transducer comprises a piezoresistive element.

3. The device of claim 1 wherein the electronic device comprises an active device.

4. The device of claim 1 wherein the electronic device comprises a passive device.

5. The device of claim 1 wherein the electronic device is coupled to the transducer with a wire bond.

6. The device of claim 1 wherein the third major surface is bonded to the first major surface with a glass frit.

7. The device of claim 1 wherein the device forms a media compatible absolute pressure sensor.

8. A media compatible vertically integrated absolute pressure sensor structure comprising:
   a first substrate comprising a semiconductor material and having a first cavity extending from a first surface to form a diaphragm;
   a transducer formed on a second surface of the first substrate, the transducer providing an output signal when the first cavity is exposed to an environmental condition;
   a second substrate comprising a semiconductor material and having a third surface and a fourth surface opposite the third surface, wherein the third surface is attached to the second surface such that a sealed chamber is formed above the diaphragm;
   an integrated circuit device formed on the fourth surface, wherein the integrated circuit device is coupled to the first substrate for receiving the output signal from the transducer; and
   a chip carrier having a pressure port, wherein the first substrate is coupled to the chip carrier such that the first cavity is in a spaced relationship with the pressure port.

9. The structure of claim 8 further comprising a second cavity formed in the second substrate, wherein the second cavity extends from the third surface.

10. The structure of claim 8 wherein the integrated circuit device includes an adjustable resistor.

11. The structure of claim 8 wherein the second substrate includes a beveled edge.

12. The structure of claim 8 wherein the chip carrier further includes conductive leads and wherein one of the first substrate and the second substrate are coupled to the conductive leads.

13. The structure of claim 12 wherein one of the first substrate and the second substrate are coupled to the conductive leads with a wire bond.

14. The structure of claim 8 wherein the third surface is attached to the second surface with a glass frit.

15. The structure of claim 8 further comprising a protective gel, wherein the protective gel covers the integrated circuit device.

16. A method for forming a vertically integrated sensor device comprising the steps of:
   forming a first cavity in a base substrate, wherein the base substrate includes a first major surface and a second major surface, and wherein the first cavity extends from the first major surface to provide a diaphragm, and wherein the base substrate is comprised of a semiconductor material;
   forming a transducer on the diaphragm;
   forming an electronic device on a cap substrate, wherein the cap substrate includes a third major surface and a fourth major surface, wherein the electronic device is formed on the fourth major surface, and wherein the cap substrate is comprised of a semiconductor material;
   attaching the cap substrate to the base substrate to provide a hermetically sealed chamber above the transducer;
   attaching the base substrate to a chip carrier, wherein the chip carrier includes an opening, and wherein the first cavity is in a spaced relationship with the opening; and
   coupling the transducer to the electronic device.

17. The method of claim 16 wherein the step of forming the electronic device includes forming a passive device.

18. The method of claim 16 wherein the step of forming the electronic device includes forming an adjustable resistor.

19. The method of claim 18 further comprising the step of adjusting the adjustable resistor after the step of attaching the base substrate to the chip carrier.

20. The method of claim 16 wherein the step of forming the electronic device includes forming an active device.

21. The method of claim 16 wherein the step of attaching the cap substrate to the base substrate includes attaching the cap substrate to the base substrate with a glass frit.

22. The method of claim 16 wherein the step of coupling the transducer to the electronic device includes coupling the transducer to the electronic device with a wire bond.

23. The method of claim 16 further comprising the steps of:
   forming a second cavity in the cap substrate; and
   forming a tapered edge on the cap substrate after the step of forming the electronic device and before the step of attaching the cap substrate to the base substrate.

* * * * *